United States Patent [19]

Woo et al.

[11] Patent Number: 4,757,026

[45] Date of Patent: Jul. 12, 1988

[54] SOURCE DRAIN DOPING TECHNIQUE

[75] Inventors: Been-Jon Woo, Saratoga; Mark A. Holler, Palo Alto; Ender Hokelek, Santa Clara; Sandra S. Lee, Los Altos, all of Calif.

[73] Assignee: Intel Corporation, Santa Clara, Calif.

[21] Appl. No.: 97,539

[22] Filed: Sep. 16, 1987

Related U.S. Application Data

[62] Division of Ser. No. 926,733, Nov. 4, 1986.

[51] Int. Cl.⁴ .......................................... H01L 21/265
[52] U.S. Cl. .......................................... 437/29; 437/30; 437/34; 437/44; 148/DIG. 82; 148/DIG. 106; 357/23.3; 357/23.9
[58] Field of Search ............... 437/29, 30, 44, 43, 437/147, 154, 157, 34; 357/23.3, 23.9, 91, DIG. 53; 148/DIG. 82, DIG. 106

[56] References Cited

U.S. PATENT DOCUMENTS 4,366,613 1/1983 Ogura et al. ............... 437/30
4,536,944 8/1985 Bracco et al. ............... 437/44
4,642,878 2/1987 Maeda ............... 437/44

OTHER PUBLICATIONS

Ghandhi, VLS1 Fabrication Principles, John Wiley and Sons, 1983, p. 230.

Primary Examiner—Brian E. Hearn
Assistant Examiner—M. Wilczewski
Attorney, Agent, or Firm—Blakely, Sokoloff, Taylor & Zafman

[57] ABSTRACT

A method of forming complementary metal oxide semiconductor field-effect transistors (CMOSFET) is described wherein the source and drain regions are disposed by ion implantation in a manner substantially perpendicular to the substrate surface in two steps, such that the concentration of impurities increases with lateral distance away from the gate electrode member to suppress the hot e injection, to prevent channeling effects, to increase punch through voltage and to increase gate-aided breakdown voltage.

2 Claims, 8 Drawing Sheets

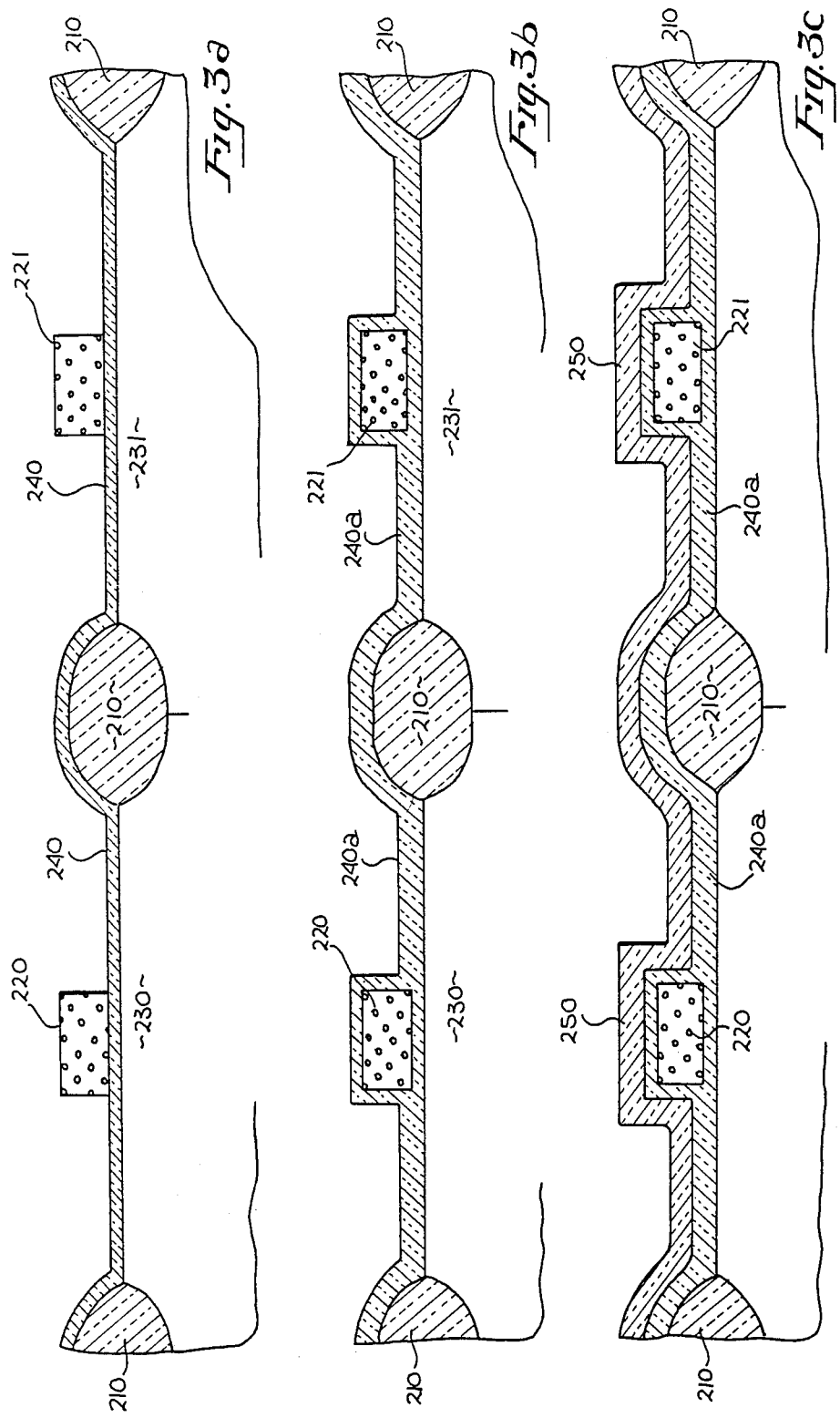

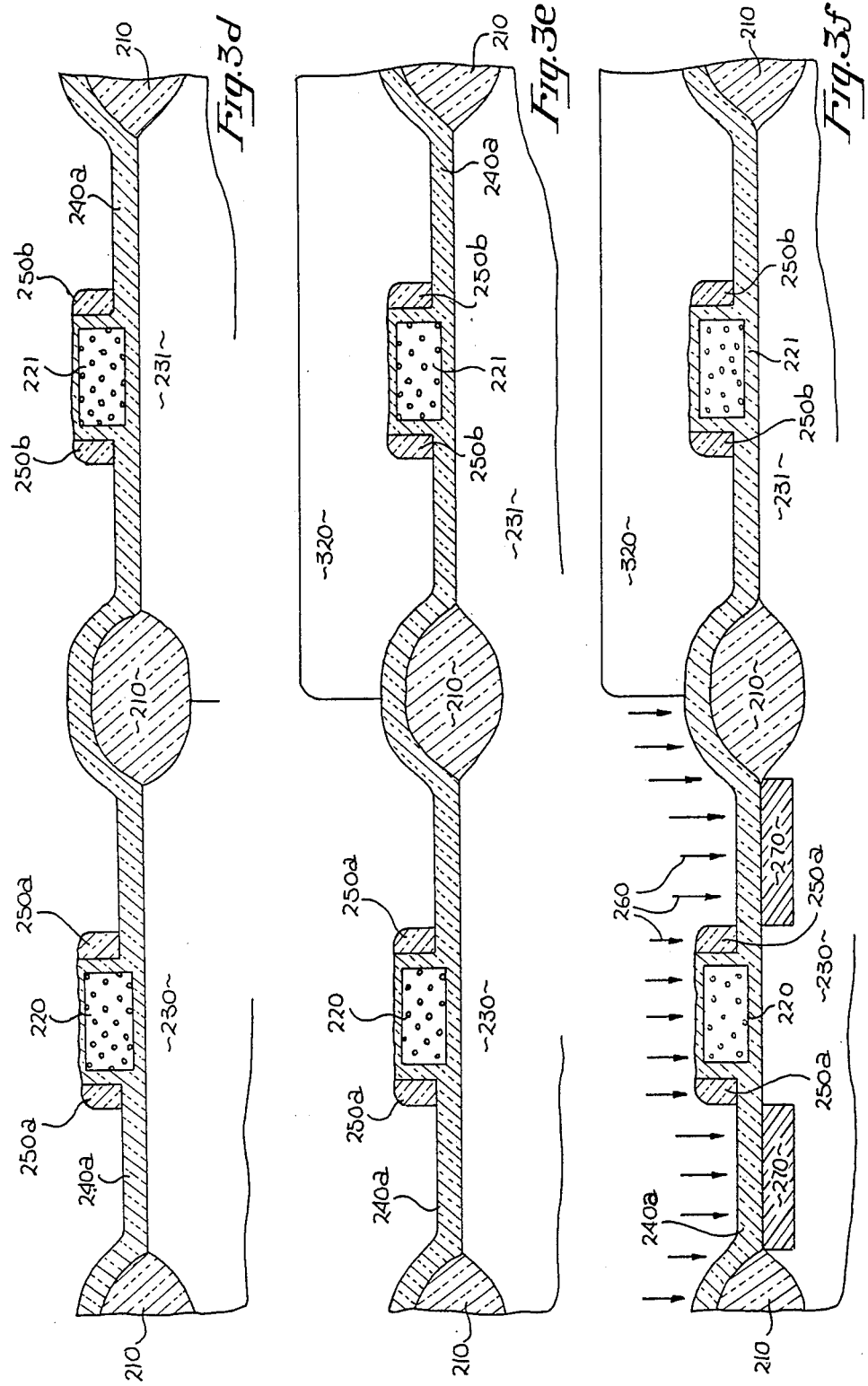

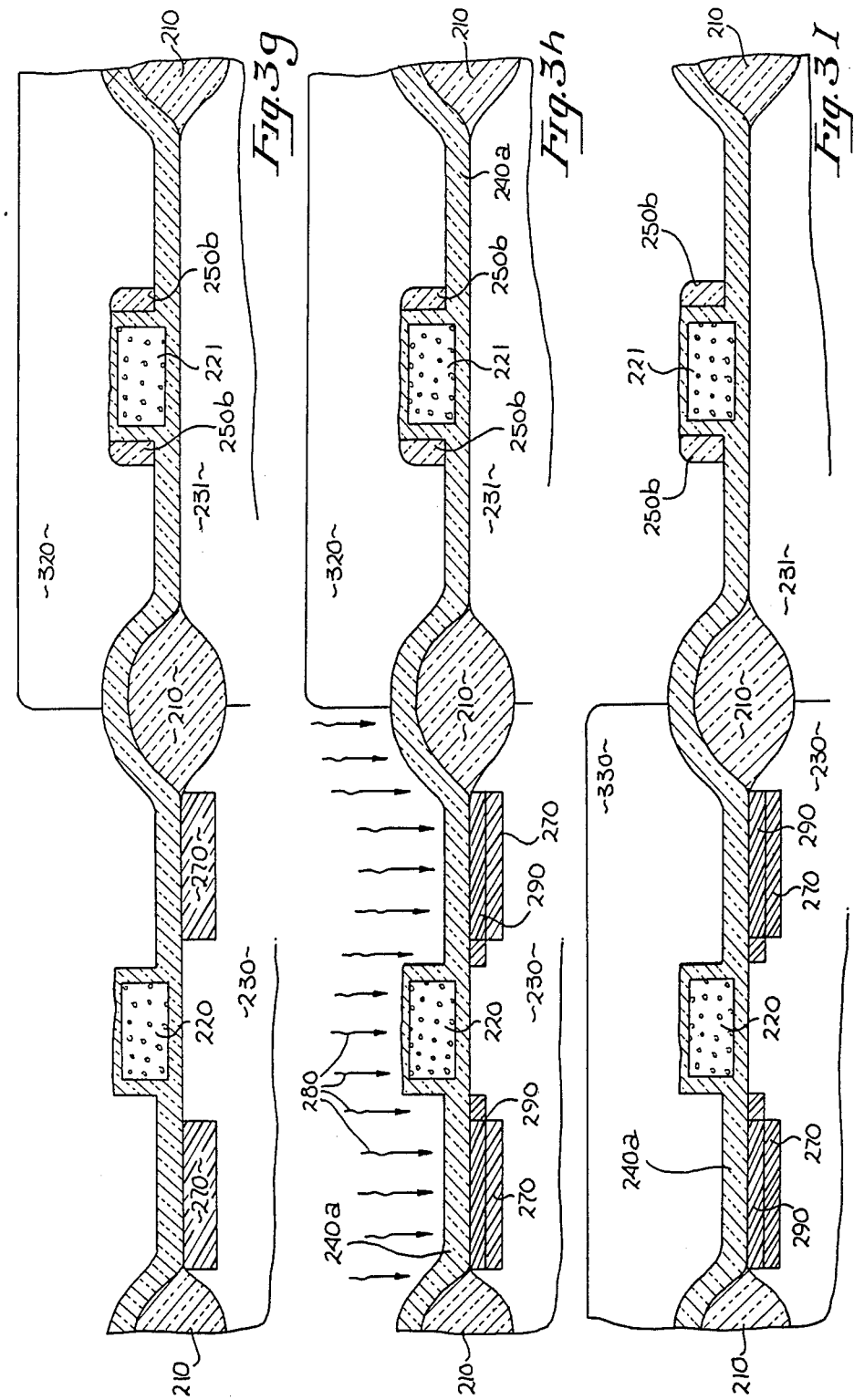

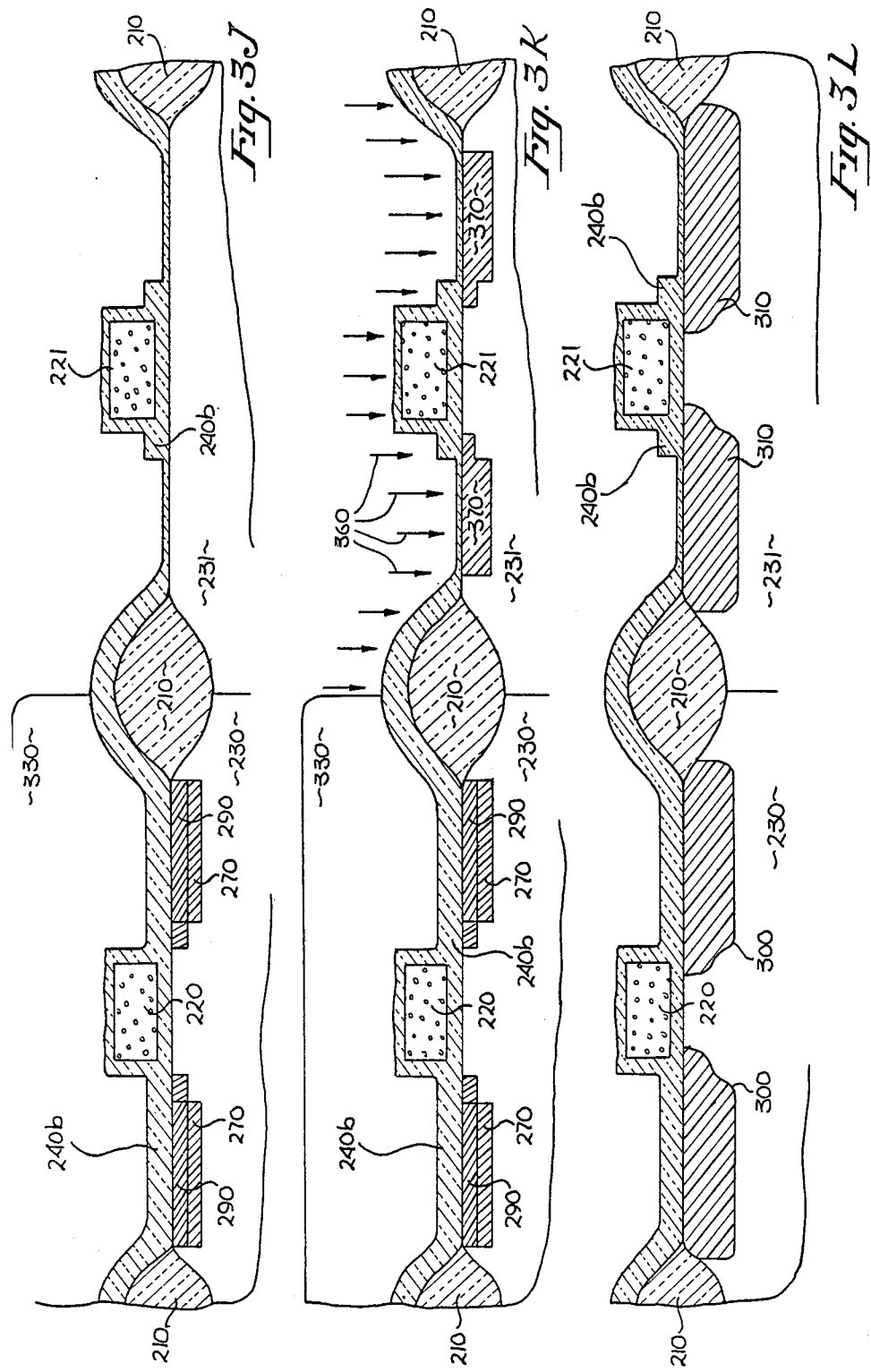

SOURCE DRAIN DOPING TECHNIQUE

This is a divisional of application Ser. No. 926,733 filed Nov. 4, 1986.

BACKGROUND OF THE INVENTION

1. Field of the Invention

This invention relates to the field of metal-oxide-semiconductor manufacturing. More particularly this invention discloses a process for forming graded junctions for source and drain regions.

2. Prior Art

In forming metal oxide semiconductor field effect transistors (MOSFET) a variety of problems exist as artifacts of the processing sequence. A high concentration of impurities is needed in the source and drain regions in the body of the semiconductor in order (1) to make good electrical contact from the metallic interface to the source/drain regions and (2) to decrease the resistivity of the source and drain regions and thereby increase the MOSFET performance characteristics. However, a small concentration of impurities in the source and drain regions is needed in order to prevent the injection of hot electrons that become trapped in the insulating layer between the gate electrode member and the semiconductor body causing degradation in threshold voltage characteristics. These competing requirements for source and drain region impurity concentrations have caused engineers to develop complex process sequences which are difficult to manufacture and achieve inconsistent results.

Ion implantation is one technique for introducing impurities into the substrate to form source and drain regions. In the field of predepositing impurities through ion implantation, a phenomenon known as channeling has been observed. Channeling is a condition where a significant portion of the implanted ions will pass through the inherent voids between atomic planes in the semiconductor crystal when the ion beam is oriented parallel to the crystal planes. This allows those channeled ions to come to rest in a location considerably deeper in the semiconductor body than desired. The depth of the ions in a semiconductor crystal after an implantation step where channeling has occurred is difficult to control. This is particularly true for ions such as phosphorus and boron.

In manufacturing MOSFETs shallow junctions for the source and drain regions are desired in the regions immediately adjacent to the region under the gate electrode member. This is because the source to drain punch through voltage decreases as junction depth increases. Thus, source and drain junctions that are formed after the ions have been predeposited in the semiconductor substrate through ion implantation in such a manner that channeling can occur are at an uncontrollable depth and generally have a low punch through voltage.

In order to counteract the effects of channeling the substrate crystal planes are skewed from parallel with respect to the ion beam and thereby form shallow junctions for the source and drain regions. By so doing the ions within the beam are not propelled in the path substantially parallel to one of the semiconductor crystal channels. Thus, the ions must strike an atom of the semiconductor crystal near the surface and come to rest within a short distance of the surface of the semiconductor substrate.

It is desirable in manufacturing MOSFETs that each individual MOSFET be formed such that the source and drain regions are substantially symmetrical one to the other. Implanting at an angle which will avoid channeling and thereby improve the punchthrough voltage characteristics of individual MOSFETs will also form a MOSFET in which the source or drain regions are asymmetrical and can thus adversely affect the performance characteristics of that device. Ion implantation machines typically used in manufacturing integrated circuits allow the wafers to be placed on the implantation chuck with random orientation. This random orientation operating in conjunction with an angled implant further compounds the manufacturing problem for MOSFETs by forming an inconsistent amount of asymmetry from one wafer to the next.

A variety of process flows have been applied in order to manufacture consistent MOSFET devices. The earliest MOSFET devices were formed by first diffusing into the source and drain regions and then defining the gate. This had the obvious disadvantage of requiring two critical mask steps. In forming MOSFETs for which the gate member was defined subsequent to the source and drain required significant gate overlap in order to ensure that the gate adequately covered the entire channel. The first major advance was to use the polysilicon gate electrode member as a diffusion mask for the source and drain regions (U.S. Pat. No. 3,475,234). This allowed the designer to manufacture a transistor with a minimum overlap by eliminating the need for mask alignment tolerance in the gate dimension with respect to the channel length.

The next advance was to use the gate member as a mask to implantation (U.S. Pat. No. 3,481,030). The major advantage of this technique was that the dose could be accurately controlled and the amount of gate to source and drain region overlap could be kept at a minimum. However, two new problems were created by this technique.

The process of ion implantation or bombardment created damage to the semiconductor substrate. This damage could only be corrected through subsequent high temperature processing known as annealing. The temperatures required to perform this anneal step in the semiconductor body would melt aluminum. Thus, the use of an aluminum gate was essentially precluded (U.S. Pat. No. 3,472,712).

Another problem that occured resulted from hot electron trapping. This problem is solved if the concentration of dopants within the source and drain regions changed gradually over the distance in the region adjacent to the source and drain junctions. Then, the electrons making the transition across the junction do not accelerate to high velocities. Without sufficient high energy electrons in the channel regions, electrons do not have sufficient energy to enter the gate electrode insulator.

Many techniques have been tried to form graded junctions. One such technique involved the use of a masking layer on top of the gate electrode structure which overhung the edges of the gate electrode member (U.S. Pat. No. 4,198,250). This structure is typically manufactured by first forming the gate electrode insulating layer, then forming a layer of the gate electrode material and lastly forming another layer used as a mask. The masking layer is etched with ordinary photomasking techniques. The gate electrode member is selectively wet etched and then overetched such that it undercuts the overlying masking layer.

Next the device is ion implanted at a sufficient energy to allow the implanted ions to penetrate the masking layer overhang. However, only a portion of those implanted ions penetrating the overhang penetrate the gate electrode insulating area and enter the underlying substrate material. Thus, the substrate underneath the masking layer overhang has a lower dopant concentration than the substrate not underneath the masking layer. Following this ion implantation with a high temperature anneal step repairs damage to the substrate and activates the dopant species.

Another similar technique is to form the same structure as previously described with the overhanging masking layer. Here the source and drain dopants are introduced with two ion implantation steps. The first implant is performed at a low energy and relatively high dose. The overhanging masking layer is then removed. The second implant is performed at a low energy and a low dose. The doping concentration in the substrate immediately adjacent the region under the gate member is relatively small. The doping concentration in the substrate spaced laterally away from the region under the gate member by the distance of the overhanging masking layer is relatively large. After annealing, a graded junction MOSFET is formed. The disadvantage of these two techniques is that very precise control is required over the etching time of the gate electrode member material. It is difficult to obtain consistent results for the length of the graded section of the source and drain junctions from one manufacturing lot to another.

Another technique is to form the insulated gate electrode member then implant two different species of the same conductivity type in the source and drain regions adjacent to region under the gate. The dopant species for this technique is selected from dopants having different diffusion constants. Then, the annealing steps used to repair crystal damage and activate the doping species will drive the faster diffusing species further. This forms a graded junction. Unfortunately, this technique is self limiting. Diffusivity of the semiconductor dopants is a function not only of the diffusion constant for each species, but is also a function of the doping concentration. Because of this the graded region will typically be shorter than can be obtained with other techniques and because the slow diffusing species will always underlap the gate, the gate aided breakdown voltages cannot be beneficial with this approach.

Another technique to form graded junctions is to first form the gate electrode member and then to deposit a uniform masking layer over the structure. By performing anisotropic etch on this masking layer, spacers composed of masking material are left behind on the vertical sidewalls of the gate electrode member. Next a heavy dose source and drain region implant is performed on the structure with the sidewall spacers. The sidewall spacers prevent these implanted ions from reaching the substrate. This heavy dose implant will form implanted regions in the substrate laterally spaced apart from the gate member on the structure with the sidewall spacers. The sidewall spacers are then removed by a selective etch. This is followed by a low dose implant to form the low concentration portion of the graded source and drain junctions. This technique had the advantage over the previous methods in that the length of the low dose regions can be more accurately controlled than with the overhanging structure described above due to the fact that the thickness of the masking layer is more easily controlled. Because of this advantage and the ability to develop tighter processing controls, smaller and smaller device sizes are possible. However, this process sequence recreates two old problems. The lightly doped implant must either (1) be performed at a small angle in order to avoid channeling and form a shallow junction which of necessity forms inconsistent and asymmetric MOSFETs thereby creating manufacturing and design problems or (2) if the implant is performed in a substantially vertical manner inconsistent junction depths are obtained. Deep source and drain junctions also causes a decrease in punch through voltage. As the punch through voltage decreases the range of acceptable operating voltages is diminished, thereby reducing applications available to the user of the MOSFET. Thus, an improved method for forming MOSFETs with graded junctions was needed.

SUMMARY OF THE INVENTION

An improved method of forming MOSFETs with graded source and drain junctions is described. An insulated gate electrode member is formed. A first masking layer capable of selective etching is formed over the upper surface and sidewalls of the insulated gate electrode member and over the semiconductor body. A second masking layer is formed over the surface of the first masking layer. An anisotropic etch is performed on the second masking layer. The anisotropic etch leaves spacers formed from the second masking layer on the sidewalls of the insulated gate electrode member over the first masking layer.

This structure is then subjected to a high dose ion implantation step. The spacers prevent the high dose implant from penetrating into the substrate adjacent the region under the gate.

The spacers on the sidewalls are removed. This structure is subjected to a low dose ion implantation step. The resulting implanted regions each have regions of low concentration adjacent the region under the gate and regions of high concentration spaced apart from the region under the gate by a distance equal to the thickness of the spacers which have no channels. An ion beam penetrating an amorphous structure is scattered, so that upon exiting the amorphous structure the beam is no longer uniform and cannot channel in a crystalline structure.

The first masking layer is an amorphous structure. The second implant penetrates the first masking layer immediately adjacent the gate at an angle substantially perpendicular to the surface of the semiconductor body. Thus, symmetrical source and drain regions are formed.

Much of the energy possessed by the ions being implanted is consumed while penetrating the first masking layer. An extremely shallow implanted region is achieved. These steps are followed by a high temperature annealing step which acts to repair damage to the semiconductor crystal caused by the ion implantation and activates the doping ions. Thus, a MOSFET is formed which has (1) source and drain regions formed symmetrical to the gate, (2) shallow junctions to improve punch through voltage characteristics, (3) low dose regions to prevent the injection of hot electrons thereby improving reliability, (4) high dose regions to improve operating characteristics, and (5) the high dose implant recessed from the gate edge to improve the gate controlled breakdown voltage for high voltage operation application.

The device which results is a much improved MOSFET. An insulated gate electrode member is positioned on a portion of a semiconductor body. Within a semiconductor body and extending a short distance into the region underneath the gate electrode member and on either side of the gate electrode member are source and drain regions. These source and drain regions are exactly symmetrical one to the other. Extending laterally away from the gate electrode member is a shallow, lightly doped portion of the source and drain regions merging into a deeper and more heavily doped portion of the source and drain region which provides high gate aided breakdown voltage.

This process is much improved over previous MOSFET processes. It is more controllable allowing for more consistent manufacturing results. Specific length and depth of the lightly doped region can be precisely reproduced, time after time.

BRIEF DESCRIPTION OF THE DRAWINGS

FIG. 1A is a cross-sectional elevation view of a substrate which shows a silicon dioxide layer and a gate member.

FIG. 1B illustrates the substrate of FIG. 1A with an additional insulative layer.

FIG. 1C illustrates the substrate of FIG. 1B with an additional oxide layer.

FIG. 1D illustrates the substrate of FIG. 1C after an etching step used to form spacers.

FIG. 1E illustrates the substrate of FIG. 1D during an ion implantation step.

FIG. 1F illustrates the substrate of FIG. 1E after additional etching steps.

FIG. 1G illustrates the substrate of FIG. 1F during an ion implantation step.

FIG. 1H illustrates the substrate of FIG. 1G with the graded junctions formed in the substrate.

FIG. 2A illustrates the substrate with an oxide layer and a gate member.

FIG. 2B illustrates the substrate of FIG. 2A with an additional oxide layer.

FIG. 2C illustrates the substrate of FIG. 2B with still another oxide layer.

FIG. 2D illustrates the substrate of FIG. 2C after etching steps used to form spacers.

FIG. 2E illustrates the substrate of FIG. 2D after additional etching steps.

FIG. 2F illustrates the substrate of FIG. 2E during ion implantation.

FIG. 2G illustrates the substrate of FIG. 2F with a graded junction.

FIGS. 3A through 3L show a third embodiment of the invention.

FIG. 3A is a cross-sectional elevation view showing a substrate which includes an oxide layer and two gate members.

FIG. 3B illustrates the substrate of FIG. 3A with an additional oxide layer.

FIG. 3C illustrates the substrate of FIG. 3B shows yet another oxide layer.

FIG. 3D illustrates the substrate of FIG. 3C after an etching step used to form spacers.

FIG. 3E illustrates the substrate of FIG. 3D after a portion of the substrate has been covered with a photoresist layer.

FIG. 3F illustrates the substrate of FIG. 3E during an ion implantation step.

FIG. 3G illustrates the substrate of FIG. 3F after an etching step.

FIG. 3H illustrates the substrate of FIG. 3G during a second ion implantation step.

FIG. 3I illustrates the substrate of FIG. 3H after another portion of the substrate has been covered with a photoresist layer.

FIG. 3J illustrates the substrate of FIG. 3I after an etching step.

FIG. 3K illustrates the substrate of FIG. 3J during an implantation step with formed graded junctions.

FIG. 3L illustrates the substrate of FIG. 3K with source and drain regions formed.

DETAILED DESCRIPTION OF THE PRESENT INVENTION

Three embodiments of the invention are disclosed. It will be clear to one of ordinary skill in the art that the invention may be practiced without following the specific details set forth in these embodiments. Well-known MOS processing is not described in the application. The present invention may be fabricated with numerous well-known techniques and processes.

MORE DETAILED DESCRIPTION OF THE DRAWINGS SHOWING THE FIRST EMBODIMENT

Figure 1A:
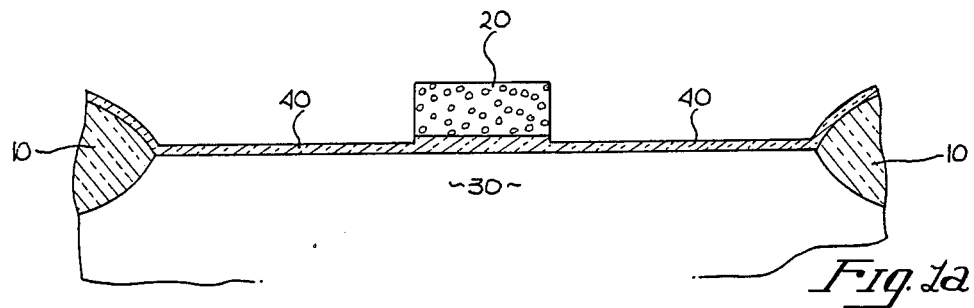
FIGS. 1A through 1H show a first embodiment of the invention.

FIG. 1A shows a semiconductor substrate 30 bounded at either end by thick field insulating isolation regions 10. Isolation regions 10 extend above and below the surface of semiconductor substrate 30. Covering the upper surfaces of both isolation regions 10 and the substrate 30 is layer 40. On a portion of the upper surface of layer 40 over substrate 30 and spaced apart from isolation regions 10 is insulated gate member 20. The thickness of layer 40 immediately underneath gate member 20 may or may not be thicker than the other portions of layer 40. Layer 40 is shown here to be slightly thinner than underneath gate member 20.

Figure 1B:
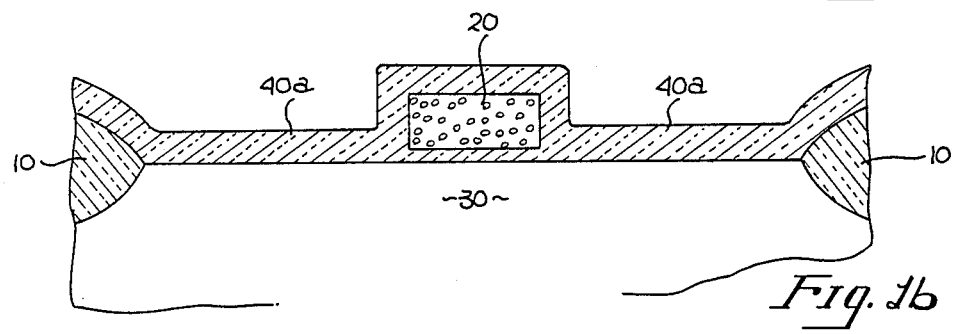

FIG. 1B shows the structure of FIG. 1A wherein insulating layer 40 has been grown thicker over the semiconductor substrate 30 and isolation layers 10 and in the process is also grown on the top and side walls of gate member 20. The changed layer 40 is shown in FIG. 1B as layer 40a.

Figure 1C:
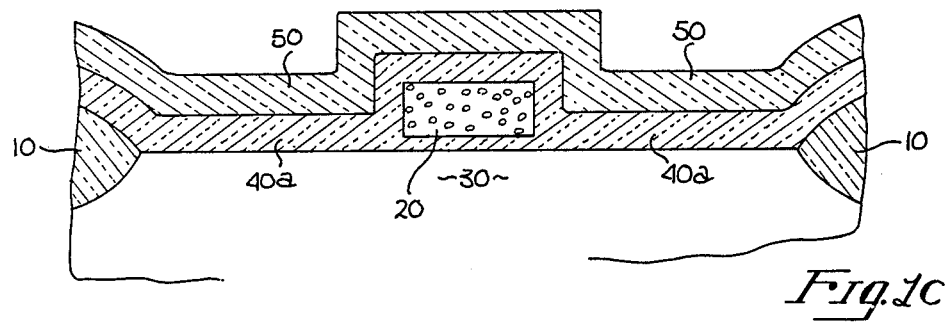

FIG. 1C shows the structure of FIG. 1B wherein layer 50 has been uniformly disposed over the upper surface of layer 40a.

Figure 1D:
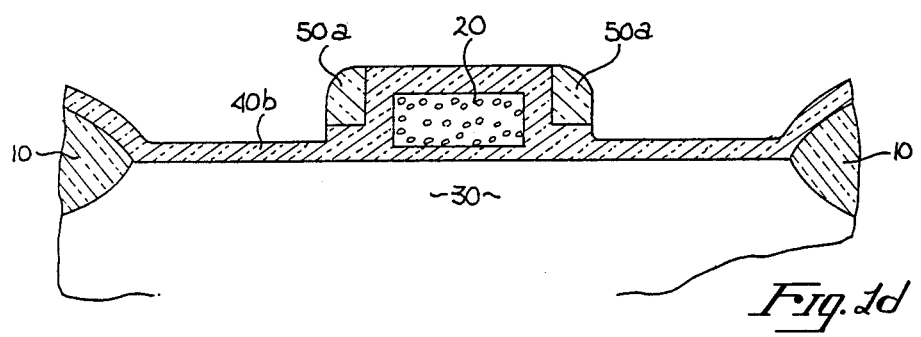

FIG. 1D shows the structure of FIG. 1C wherein the upper surface of layer 50 has been anisotropically removed vertically from the top. Layer 50 only remains on the vertical sidewalls of layer 40a spaced apart from gate member 20 by layer 40a forming spacers 50a. In some cases, portions of layer 40a may also be removed forming thinner portions of insulating layer 40a. This is shown to have occurred in this embodiment forming layer 40b.

Portions of insulating layer 40a may or may not also be removed at the same time as portions of insulating layer 50. The structure of insulating layer 40a remaining is shown as insulating layer 40b. In FIG. 1D, layer 40b is shown to be thinner over the semiconductor substrate 30 in those portions of layer 40a not underneath spacers 50a.

Figure 1E:
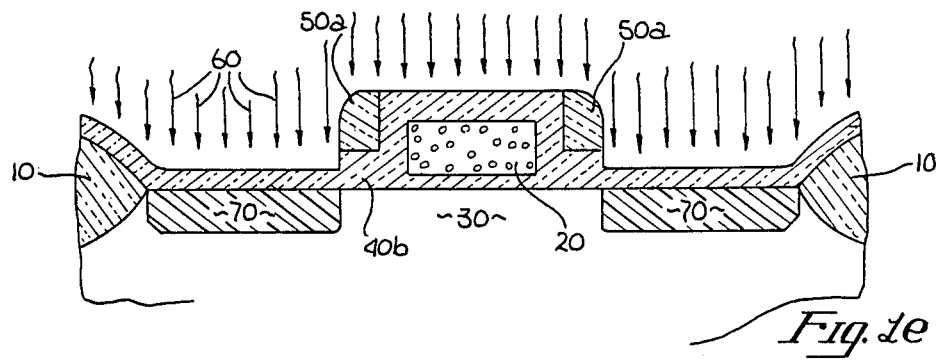

FIG. 1E shows the structure of FIG. 1D onto which ion beam 60 is caused to impinge. The ions of ion beam 60 penetrate layer 40b and enter substrate 30 to form implanted regions 70 between the vertical edges of spacers 50a which are furthest from gate member 20 and isolation regions 10. Ion beam 60 is shown to impinge on the structure of FIG. 1E in a substantially perpendicular fashion.

Figure 1F:
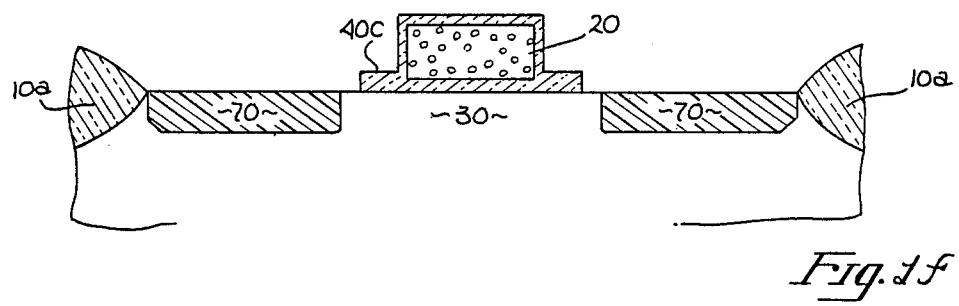

FIG. 1F shows the structure of FIG. 1E from which upper surfaces have been selectively removed. Sidewall spacers 50a have been completely removed. Portions of insulating layer 40b may be completely removed from those portions of layer 40b over substrate 30 which previously were not underneath spacers 50a, isolation regions 10 and the top surface of gate member 20 forming layer 40c. In certain circumstances the isolation regions 10 may also be thinned slightly to become isolation regions 10a. These changes to layer 40b and isolation region 10 are not necessary for the present invention.

Figure 1G:
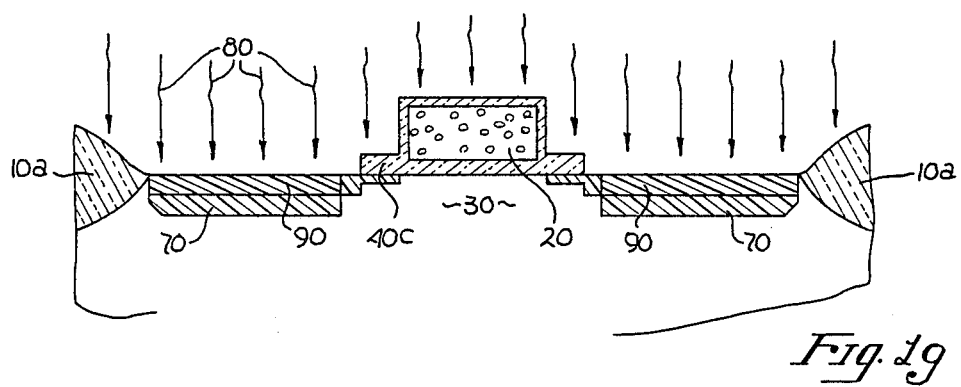

FIG. 1G shows the structure of FIG. 1F onto which ion beam 80 is caused to impinge. The ions of ion beam 80 penetrate layer 40c to form ion implanted regions 90 in substrate 30. Ion implanted regions 90 are formed in substrate 30 between the portions of substrate 30 adjacent the regions underneath the portions of layer 40c on the sidewalls of gate member 20 and isolation regions 10. Ion beam 80 impinges on the surface of the structure of FIG. 1F in a substantially perpendicular manner.

Those portions of implanted region 90 formed from ions of ion beam 80 which penetrated through insulating layer 40c are shallower than the remaining portions of ion implanted regions 90. The portions of the ion implanted region 90 not underneath the insulating layer 40c and not contained within the ion implanted region 70 may be at some depths deeper than the portions of ion implanted region 90 contained within the ion implanted region 70.

Figure 1H:
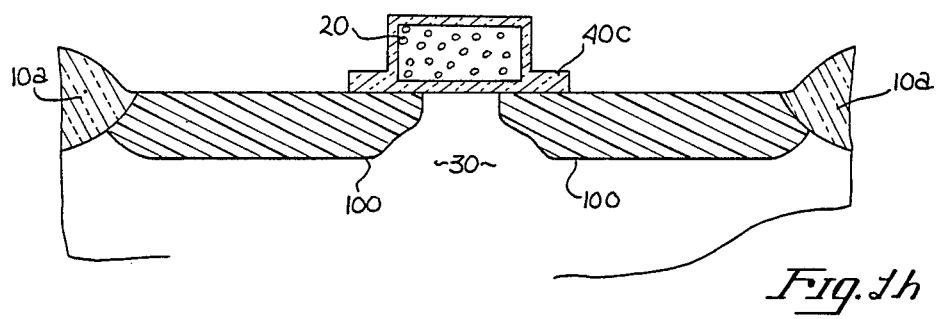

FIG. 1H shows the structure of FIG. 1G wherein ion implanted regions 70 and 90 have been driven further into substrate 30 both vertically and laterally to form the source and drain junctions 100. At least some portion of the ions in ion implanted regions 70 or 90 are driven underneath gate member 20 such that junctions 100 extend underneath the edges of gate member 20.

DISCUSSION OF PROCESSING FOR THE FIRST EMBODIMENT

On a portion of the semiconductor substrate 30 and in a region between two oxide layers 10 is grown a thermal oxide layer 40 to serve as a gate electrode insulator. Conductive material is disposed on the surface of insulating layer 40 and is then defined and etched to form gate electrode member 20. The structure is then exposed to further thermal oxidation which will increase the thickness of thermal oxide layer 40 to become layer 40a which is formed over substrate 30, isolation regions 10 and the top and side walls of the gate electrode member 20. A low temperature oxide layer 50 is deposited over the surface of the thermal oxide layer 40a. The low temperature oxide layer is exposed to an anisotropic etch which will remove oxidation material only from the extreme top surface. By correctly timing the etch process to alyer 50, spacers 50a remain from layer 50 on the sidewalls of gate member 20 outside of thermal oxidation layer 40b.

The lateral thickness of layer 50a will be approximately the thickness of the deposited layer 50. The deposition thickness of a low temperature oxide is relatively easy to control to a precise dimension. The anisotropic etch performed to remove low temperature oxide layer 50 may also remove portions of the thermal oxidation layer. There may be some thinning of those portions of the thermal oxidation layer 40a not protected from the anisotropic etch step by sidewall spacers 50a. Thus, portions of thermal oxide layer, 40a over the upper surface of the gate electrode member 20 and above the semiconductor substrate 30 may be etched somewhat by the anisotropic etching step, forming thermal oxidation layer 40b.

This structure is then exposed to a first ion implantation step. Because the thermal oxidation layer 40b has an amorphous atomic structure, ion beam 60 becomes scattered passing through thermal oxide layer 40b and no channeling can occur in the semiconductor substrate 30. Thus, the first implantation step may be performed at an angle substantially perpendicular to substrate 30. Ion implanted regions 70 are formed in a precisely controlled manner that is symmetrical to gate electrode member 20.

The spacers are then removed. This is typically done by standard wet etching techniques. Occasionally this etching process may attack the thermal oxidation layer 40b and the isolation regions 10. The resulting structure 40c may leave no oxidation layer at all except where layer 40b was previously protected by the sidewall spacers 50a. Thus, the substrate 30 and the top surface of the gate member 20 may be exposed. This is not necessary or important to the invention.

This structure is subjected to ion beam 80 which ions must be of the same conductivity type as ion beam 60. The portion of ion beam 80 that penetrates the remaining portions of a thermal oxidation layer 40c will form shallow implanted regions in semiconductor substrate 30. This is due to the fact that on penetrating a thermal oxidation layer prior to entering a semiconductor substrate an ion beam will become scattered and no longer susceptible to channeling. The portion of ion beam 80 that enters the ion implanted region 70 previously implanted will also not be susceptible to channeling. This is because ion beam 60 in forming ion region 70 has disrupted the crystal structure of the semiconductor substrate 30. Thus, the ion implanted region 70 is an amorphous structure through which channeling is not possible. The portion of ion beam 80 entering semiconductor substrate 30 between the ion implanted region 70 and thermal oxidation layer 40c may be subject to channeling into semiconductor substrate 30. The length of this channeled region may be controlled through the etching process of removing sidewall spacers 50a. In most situations the channeled region will be sufficiently small so that it will not adversely affect device performance.

The entire structure is subjected to high temperature processing step in order to diffuse some portion of the implanted ions in region 90 and/or 70 underneath the edge of gate electrode member 20, to activate the ion species in the crystal and to repair crystal damage caused by ion implantation.

MORE DETAILED DESCRIPTION OF THE DRAWINGS FOR THE SECOND EMBODIMENT

Figure 2A:
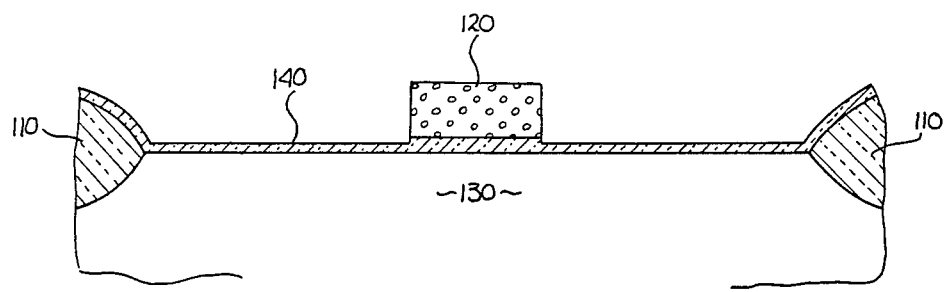
FIG. 2A through 2G show a second embodiment of the invention.

FIG. 2A shows a semiconductor substrate 130 bounded at either end by thick field insulating isolation regions 110. Isolation regions 110 extend above and below the surface of substrate 130. Covering the upper surfaces of substrate 130 and isolation regions 110 is layer 140. On a portion of the upper surface of 140 over substrate 130 and spaced apart from isolation regions 110 is insulated gate member 120. The thicknes of layer 140 immediately underneath gate member 120 may or may be thicker than the other portions of layer 140. Layer 140 is shown here to be slightly thicker underneath gate member 120.

Figure 2B:
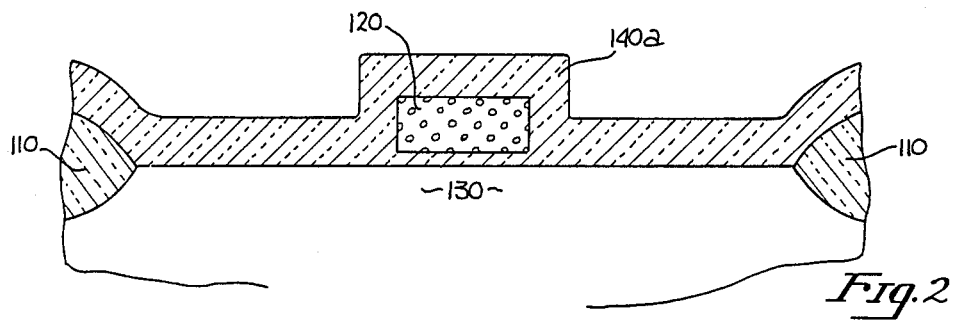

FIG. 2B shows structure of FIG. 2A wherein insulating layer 140 has been grown thicker over the semiconductor substrate 130 and isolation layers 110 and in the process is also grown on the top and side walls of gate member 120. The changed layer 140 is shown in FIG. 2B as layer 140a.

Figure 2C:
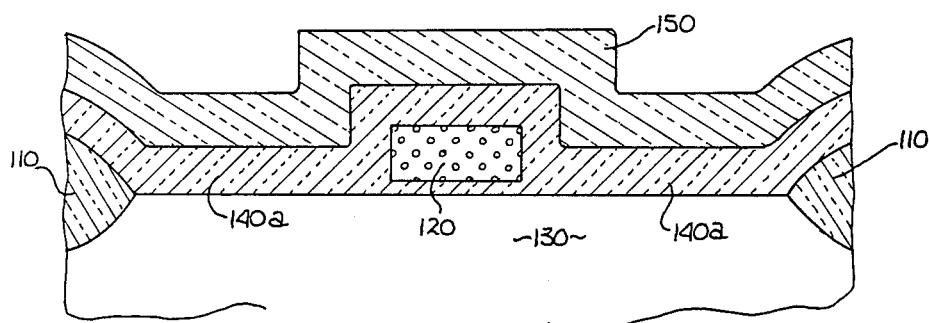

FIG. 2C shows the structure of FIG. 2B wherein layer 150 has been disposed with a uniform thickness on the upper surface of layer 140a.

Figure 2D:
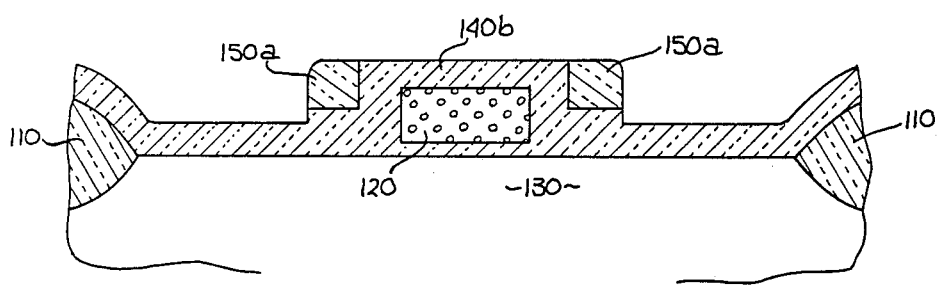

FIG. 2D shows the structure of FIG. 2C wherein the upper surface of layer 150 has been anisotropically removed vertically from the top. Layer 150 only remains on the vertical sidewalls of layer 140a spaced apart from gate member 120 by layer 140a forming spacers 150a. In some cases, portions of layer 140a may also be removed forming thinner portions of insulating layer 140a. This is shown to have occurred in this embodiment forming layer 140b.

Figure 2E:
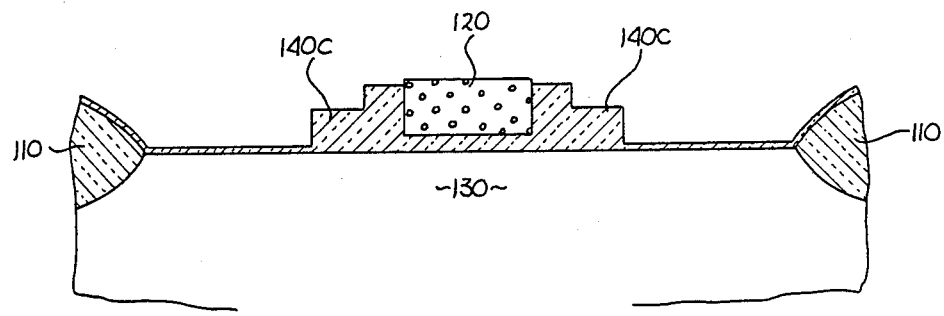

FIG. 2E shows the structure of FIG. 2D wherein layer 150a has been removed. The process of removing layers 150a also removes portions of layer 140b leaving layer 140c. Layer 140c consists of regions of three distinct heights. The thickest vertical portion of layer 140c is immediately adjacent and on either side of gate member 120. The portion of layer 140c of intermediate height are spaced apart from gate member 120 by the highest portions of layer 140c and are on either side of gate member 120. The intermediate portions of layer 140c are located underneath where layers 150a were positioned in FIG. 2D. The thinnest portions of layer 140c are spaced apart from gate member 120 by the highest and intermediate portions of layer 140c and are on either side of gate member 120. The thin regions of layer 140c, depending upon the specific application, may be completely removed.

Figure 2F:
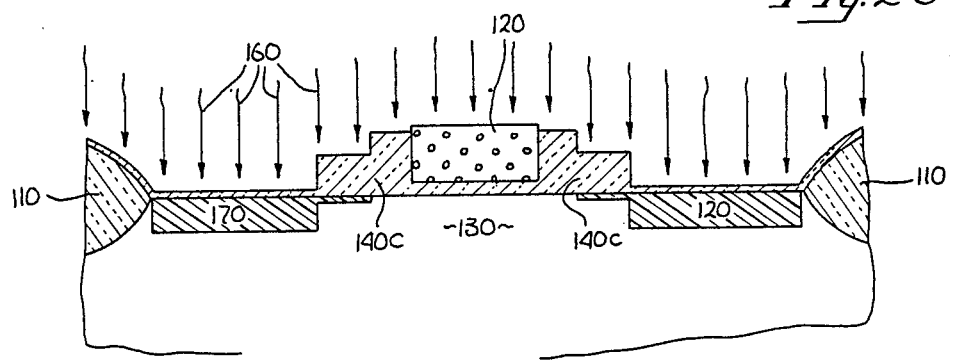

FIG. 2F shows the structure of FIG. 2E onto which ion beam 160 is caused to impinge. The ions of ion beam 160 penetrate layer 140c and enter the substrate 130 to form ion implanted regions 170. In forming ion implanted regions 170, the ions of ion beam 160 penetrate the thin and intermediate portions of layer 140c. Virtually, all of the ions in ion beam 160 penetrating the thin portion of layer 140c reach the substrate 130 and form relatively deep portions of implanted regions 170. Some portion of the ions of ion beam 160 penetrating the intermediate portion of layer 140c become trapped within the intermediate portion of layer 140c allowing only a reduced number of ions to penetrate into substrate 130. The ions of ion beam 160 penetrating the intermediate portion of layer 140c enter substrate 130 and form a relatively shallow portion of implanted region 170. Ion implanted regions 170 are formed in substrate 130 between the highest portions of layer 140c and the isolation regions 110. Ion beam 160 is shown to impinge on the structure of FIG. 2F in a substantially perpendicular fashion.

Figure 2G:
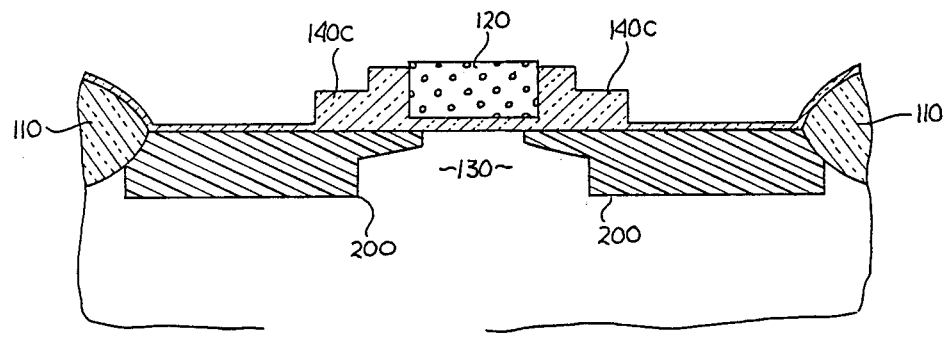

FIG. 2G shows the structure of FIG. 2F wherein ion implanted region 170 has been driven further into substrate 130 both laterally and vertically forming junctions 200. A sufficient portion of the ions contained within ion implanted region 170 come to rest underneath gate member 120 such that junctions 200 extend underneath the edges of gate member 120.

DISCUSSION OF THE PROCESSING FOR THE SECOND EMBODIMENT

On a portion of the semiconductor substrate 130 and in a region between two oxide layers 110 is grown a thermal oxide layer 140 to serve as a gate electrode insulator. Conductive material is disposed on the surface of insulating layer 140 and is then defined and etched to form gate electrode member 120. The structure is then exposed to further thermal oxidation which will increase the thickness of thermal oxide layer 140 to become layer 140a which is formed over substrate 130, isolation regions 110 and the top and side walls of the gate electrode member 120. A low temperature oxide layer 150 is deposited over the surface of the thermal oxide layer 140a. The low temperature oxide layer is exposed to an anisotropic etch which will remove oxidation material only from the extreme top surface. By correctly timing the etch process to layer 150, spacers 150a remain from layer 150 on the sidewalls of gate member 120 outside of thermal oxidation layer 140b.

The lateral thickness of layer 150a will be approximately the thickness of the deposited layer 150. The deposition thickness of a low temperature oxide is relatively easy to control to a precise dimension. The anisotropic etch performed to remove low temperature oxide layer 150 may also remove portions of the thermal oxidation layer 140a. There may be some thinning of those portions of thermal oxidation layer 140a not protected from the anisotropic etch step by sidewall spacers 150a. Thus, portions of thermal oxide layer 140a on the upper surface of the gate electrode member 120 and above the semiconductor substrate 130 may be etched somewhat by the anisotropic etching step, forming thermal oxidation layer 140b.

The spacers 150a are then removed. This is typically done by standard wet etching techniques. This etching process will attack the thermal oxidation layer 140b and the isolation regions 110. The resulting layer 140c may leave no oxidation layer at all except where layer 140b was previously protected by the sidewall spacers 150a.

Thus, the substrate 130 and the top surface of the gate member 120 may be exposed. This is not necessary or important to the invention.

The structure of layer 140c will have specific regions of three heights. Adjacent gate member 120 is the region of greatest height. Adjacent the highest regions but away from gate member 120 are intermediate height regions. Adjacent the intermediate height regions away from gate member 120 are the regions of smallest height.

This structure is subjected to ion beam 160. Ion beam 160 penetrates layer 140c and enters substrate 130 forming ion implanted regions 170. No channeling will occur in circumstances where the ion beam first penetrates an amorphouse structure because the beam becomes scattered and the ions no longer have a uniform direction. Thus, in this embodiment the implanted region adjacent gate member 120 will be shallow because of first penetrating layer 140c.

Layer 140a must be grown sufficiently thick so that some portion of the ions in ion beam 160 will fail to penetrate the intermediate thickness region of layer 140c (the thickness of layer 140c is dependent on how thick layer 140a is grown). Because a portion of the ions of ion beam 160 fail to reach substrate 130 the concentration of ions in ion implanted region 170 underneath the intermediate thickness region of layer 140c will be smaller than the concentration of ions in the implanted 170 underneath the smallest thickness region of layer 140c.

The entire structure is subjected to high temperature processing step in order to diffuse some portion of the implanted ions in region 170 underneath the edge of gate electrode member 120, to activate the ions species in the crystal and to repair crystal damage caused by ion implantation.

MORE DETAILED DESCRIPTION OF THE DRAWINGS FOR THE THIRD EMBODIMENT

This third embodiment shows the invention used to manufacture a complementary-metal-oxide semiconductor (CMOS) device. This embodiment shows the formation of one transistor utilizing the processing of the first embodiment and a second transistor utilizing the processing of the second embodiment.

FIG. 3A shows a structure containing two adjoining continous connected substrates of opposite conductivity type, 230 and 231. Each such substrate is bounded at either end by thick field insulating isolation regions, 210. One such isolation region 210 bounds the end of both substrates 230 and 231 at the point of connection of substrates 230 and 231. Covering the upper surfaces of substrates 230 and 231 and over the isolation regions 210 is insulating layer 240. Disposed on a portion of insulating layer 240 over substrate 230 and spaced apart from isolation regions 210 is gate member 220. Disposed on layer 240 over a portion of substrate 231 and spaced apart from isolation regions 210 is gate member 221. The thickness of layer 240 immediately underneath gate members 220 and 221 may or may not be thicker than the other portions of layer 240. Layer 240 is shown here to be of uniform thickness.

FIG. 3B shows the structure of FIG. 3A wherein insulating layer 240 has been grown thicker over substrates 230 and 231, isolation regions 210 and in the process is also grown on the top and sidewalls of gate member 220 and 221. The changed layer 240 is shown in FIG. 3B as layer 240a.

FIG. 3C shows the structure of FIG. 3B wherein layer 250 has been disposed with a uniform thickness on the upper surface of layer 240a.

FIG. 3D shows the structure of FIG. 3C wherein the upper surface of layer 250 has been anisotropically removed on the top. Layer 250 only remains on the vertical sidewalls of layer 240a spaced apart from gate member 220 and 221 by layer 240a forming spacers 250a and 250b. Spacers 250a and 250b remain on the sidewalls of gate members 220 and 221, respectively. In some cases, portions of layer 240a may also be removed forming thinner portions of insulation layer 140a. This is not shown here.

FIG. 3E shows the structure of FIG. 3D wherein masking layer 320 has been disposed on an upper surface above and completely covering the regions containing substrate 231. Masking layer 320 thus covers a portion of layer 240a, isolation layers 210, spacer members 250b, gate member 221.

FIG. 3F shows the structure of FIG. 3E onto which ion beam 260 is caused to impinge. The ions of ion beam 260 penetrate layer 240a and enter substrate 230 to form ion implanted regions 270. Ion implanted regions 270 are formed in substrate 230 between the vertical edges of spacers 250a which are furthest from gate member 220 and isolation regions 210. Ion beam 260 is shown to impinge on the structure of FIG. 3E in a substantially perpendicular fashion.

FIG. 3G shows the structure of FIG. 3F wherein spacers 250a have been removed. Portions of layer 240a may or may not be thinned. Here layer 240a is shown to be unchanged.

FIG. 3H shows the structure of FIG. 3G onto which ion beam 280 is caused to impinge. The ions of ion beam 280 penetrate layer 240a to form ion implanted regions 290 in substrate 230. Ion implanted regions 290 are formed in substrate 230 between the portions of substrate 230 adjacent the regions underneath the portions of layer 240a on the sidewalls of gate member 220 and isolation regions 210.

FIG. 3I shows the structure of FIG. 3H wherein layer 320 has been removed. Layer 330 has been disposed on an upper surface above and completely covering the regions containing substrate 230. Masking layer 330 thus covers a portion of layer 240a, isolation region 210, spacer members 250b, gate member 220.

FIG. 3J shows the structure of FIG. 3I wherein layer 250b has been removed. The process of removing layers 250b also removes portions of layer 240a leaving layer 240b. Layer 240b consists of regions of three distinct heights. The thickest vertical portion of layer 240b is immediately adjacent and on either side of gate member 211. The portion of layer 240b of intermediate height are spaced apart from gate member 221 by the highest portions of layer 240b and are on either side of gate member 221. The intermediate portions of layer 240b are located underneath where layers 250b were positioned in FIG. 3I. The thinnest portions of layer 240b are spaced apart from gate member 221 by the highest and intermediate portions of layer 240b and are on either side of gate member 221. The thin regions of layer 240b, depending upon the specific application, may be completely removed.

FIG. 3K shows the structure of 3J onto which ion beam 360 is caused to impinge. The ions of ion beam 360 penetrate layer 240b and enter the substrate 231 to form ion implanted regions 370. In forming ion implanted regions 370, the ions of ion beam 360 penetrate the thin and intermediate portions of layer 240b. Virtually, all of the ions in ion beam 360 penetrating the thin portion of layer 240b reach the substrate 231 and form relatively deep portions of implanted regions 370. Some portion of the ions of ion beam 360 penetrating the intermediate portion of layer 240b become trapped within the intermediate portion of layer 240b allowing only a reduced number of ions to penetrate into substrate 231. The ions of ion beam 360 penetrating the intermediate portion of layer 240b enter substrate 231 and form a relatively shallow portion of implanted region 370. Ion implanted regions 370 are formed in substrate 231 between the highest portions of layer 240b and the isolation regions 210. Ion beam 360 is shown to impinge on the structure of FIG. 3K in a substantially perpendicular fashion.

FIG. 3L shows the structure of FIG. 3K wherein ion implanted regions 270 and 290 have been driven further into substrates 230 both laterally and vertically forming junctions 300. Ion implanted regions 370 have been driven further into substrate 231 both laterally and vertically forming junctions 310. A sufficient portion of the ions contained within ion implanted regions 270 and 290 come to rest underneath gate member 220 such that junctions 300 extend underneath the edges of gate member 220. A sufficient portion of the ions contained within ion implanted regions 370 come to rest underneath gate member 221 such that junctions 310 extend underneath the edges of gate member 221.

PROCESSING FOR THE THIRD EMBODIMENT

The details for forming the two MOS devices for the third embodiment are the same as set forth above for the first embodiment and the second embodiment.

Additionally, substrate regions 230 and 231 must be of opposite conductivity type. For example, one substrate region can comprise a doped well.

The ions in ion beam 260 and 280 are of the same conductivity type and of opposite conductivity type to the ions in ion beam 360. The high temperature steps used to drive the ion implanted regions and activate the ions are typically performed at the same time. However, depending upon the species used and the requirements of the process the high temperature steps for one of the devices may occur prior to the implantation step for the second device.

Note that the processing of the first embodiment can be used to form both the n and p channel device in a CMOS integrated circuit, and likewise, the processing of the second embodiment can be used to form both the n and p channel device in a CMOS integrated circuit.

Thus, an improved process for forming MOSFETs has been disclosed.

We claim:

1. A method of fabricating a complementary metal-oxide-semiconductor (CMOS) integrated circuit where at least two insulated gate members are formed on a portion of a semiconductor substrate, comprising the steps of:
   (a) forming a thermal oxidation insulating layer over said substrate, including over opposite sides and upper surfaces of a first and second gate members, said first gate member being formed on a first portion of said substrate and said second gate member being formed on a second portion of said substrate;
   (b) forming low-temperature oxide spacer members on said opposite sides of said first and second gate members over said insulating layer;
   (c) masking said second gate and said second portion of said substrate;
   (d) causing first ions of a conductivity type determining impurity of a first conductivity type to impinge on the structure resulting from step (c) surrounding said first gate, wherein ion implanted regions of said first ions are formed in said substrate surrounding said first gate, said spacers and first gate member functioning as a mask and preventing said first ions from reaching said substrate, such that first ion implanted regions are formed away from said substrate underlying said spacers and first gate member;
   (e) removing said spacers from about said first gate;
   (f) causing second ions of a conductivity type determining impurity of said first conductivity type to impinge on the structure resulting from step (e) surrounding only said first gate member wherein said first gate member functions to mask its underlying substrate from said second ions, such that second ion implanted regions are formed immediately adjacent to substrate underlying said first gate and having lower concentration of ions than substrate disposed further from said first gate member;
   (g) masking said first gate and said first portion of said substrate; and exposing said second gate and said second portion of said substrate;
   (h) etching selectively said thermal oxidation insulating layer and said spacers over said second portion of said substrate, such that all spacers are removed and portions of said thermal oxidation insulating layer previously underlying said spacers are at a larger thickness than said thermal oxidation insulating layer previously not underlying said spacers about said second gate;
   (i) causing third ions of a conductivity type determining impurity of a second conductivity type to impinge on the structure resulting from step (h) surrounding said second gate member, such that said substrate immediately adjacent to substrate underlying said second gate member and having lower concentration of ions than substrate disposed further from said second gate member;
   (j) heating said substrate to diffuse at least a portion of said ions of first conductivity type determining impurities underneath at least a portion of said first gate member and ions of said second conductivity type determining impurities underneath at least a portion of said second gate;
   whereby a CMOS integrated circuit is formed.

2. A method of fabricating a complimentary metal-oxide-semiconductor (CMOS) integrated circuit comprising the steps of:
   (a) forming a first insulated gate on a first region of a semiconductor substrate;
   (b) forming a second insulated gate on a second region of said substrate;
   (c) forming a thermal oxidation layer over said substrate and over the top and side wall surfaces of said first and second gates;
   (d) forming a low temperature oxidation layer over said thermal oxidation layer;
   (e) etching selectively a portion of said low temperature oxidation layer, wherein said low temperature oxidation layer remains on said side wall surfaces of said first and second gates to form spacers;
   (f) masking said second region;
   (g) causing first ions of a conductivity type determining impurity of a first conductivity type to impinge on the structure resulting from step (f), such that first ion implanted regions are formed in said first region away from said substrate underlying said spacers and said first gate;
   (h) removing said low temperature oxidation spacers from the side walls from said first gate;
   (i) causing second ions of a conductivity type determining impurity of said first conductivity type to impinge on the structure resulting from step (h) such that said substrate of said first region immediately adjacent to substrate underlying said first gate having a lower concentration of ions than substrate disposed further from said first gate;
   (j) masking said first regions and exposing said second region;
   (k) etching said low temperature oxidation layer and said thermal oxidation layer over said second region, such that all spacers are removed and portions of said thermal oxidation layer previously underlying said spacers are at a larger thickness than said thermal oxidation layer previously not underlying said spacers;

(l) causing third ions of a conductivity type determining impurity of a second conductivity type to impinge on the structure resulting from step (k) such that said substrate immediately adjacent to substrate underlying said second gate having lower concentration of ions than substrate disposed further from said second gate;

(m) heating to activate said ions of first and second conductivity type determining impurities by diffusing at least a portion of said ions of first conductivity type determining impurities underneath at least a portion of said first gate and diffusing said ions of second conductivity type determining impurities underneath at least a portion of said second gate;

whereby a CMOS integrated circuit is formed.

* * * * *

UNITED STATES PATENT AND TRADEMARK OFFICE
CERTIFICATE OF CORRECTION

PATENT NO. : 4,757,026

DATED : July 12, 1988

INVENTOR(S) : Woo, et al.,

It is certified that error appears in the above-identified patent and that said Letters Patent is hereby corrected as shown below:

On the title page:

[75] Inventor: delete "Ender Hokelek" insert --Ender Hökelek--

Col. 07, Line 66  delete "alyer" insert --layer--

Signed and Sealed this

Eleventh Day of September, 1990

Attest:

HARRY F. MANBECK, JR.

Attesting Officer

Commissioner of Patents and Trademarks